(12) United States Patent
Miyamoto et al.

(10) Patent No.: US 11,101,404 B2
(45) Date of Patent: Aug. 24, 2021

(54) METHOD FOR MANUFACTURING SEMICONDUCTOR DEVICE AND SEMICONDUCTOR DEVICE

(71) Applicant: NICHIA CORPORATION, Anan (JP)

(72) Inventors: Yoshinori Miyamoto, Tokushima (JP);
Tokutaro Okabe, Tokushima (JP);
Yuya Kagoshima, Tokushima (JP);
Keisuke Higashitani, Tokushima (JP);
Chiaki Ozaki, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/354,056

(22) Filed: Mar. 14, 2019

(65) Prior Publication Data
US 2019/0296190 A1 Sep. 26, 2019

(30) Foreign Application Priority Data

Mar. 26, 2018 (JP) .............................. JP2018-058967
Sep. 25, 2018 (JP) .............................. JP2018-178761

(51) Int. Cl.
| | | |
|---|---|---|
| *H01L 33/20* | (2010.01) | |
| *H01L 33/12* | (2010.01) | |
| *H01L 33/32* | (2010.01) | |
| *H01L 33/06* | (2010.01) | |
| *H01L 33/00* | (2010.01) | |

(52) U.S. Cl.
CPC ............ *H01L 33/12* (2013.01); *H01L 33/007* (2013.01); *H01L 33/06* (2013.01); *H01L 33/32* (2013.01)

(58) Field of Classification Search
CPC ......... H01L 33/20; H01L 33/12; H01L 33/32; H01L 33/007
See application file for complete search history.

(56) References Cited

U.S. PATENT DOCUMENTS

| | | | |
|---|---|---|---|
| 2004/0004223 A1* | 1/2004 | Nagahama | H01L 33/06 257/74 |
| 2013/0087807 A1 | 4/2013 | Ikuta et al. | |
| 2014/0077223 A1* | 3/2014 | Choe | H01L 21/20 257/76 |
| 2014/0166980 A1* | 6/2014 | Goda | H01L 33/32 257/13 |
| 2015/0372189 A1* | 12/2015 | Matsuura | H01L 33/32 257/13 |
| 2017/0062655 A1* | 3/2017 | Hsu | H01L 21/0243 |
| 2018/0083107 A1* | 3/2018 | Birner | H01L 29/2003 |

FOREIGN PATENT DOCUMENTS

| | | |
|---|---|---|
| CN | 207134376 U | 3/2018 |
| JP | 2008-290919 A | 12/2008 |
| JP | 2014-139964 A | 7/2014 |
| JP | 2017-069507 A | 4/2017 |
| WO | WO-2011/161975 A | 12/2011 |

* cited by examiner

*Primary Examiner* — Michele Fan
(74) *Attorney, Agent, or Firm* — Foley & Lardner LLP (57) ABSTRACT

A method for manufacturing a semiconductor device includes: preparing a wafer including sapphire, the wafer having an upper surface that includes a first region and a second region, the second region surrounding the first region and located at a position at least 2 μm higher or lower than the first region; and forming a semiconductor layer at the upper surface, the semiconductor layer including at least one layer that comprises $Al_zGa_{1-z}N$ ($0.03 \le z \le 0.15$).

16 Claims, 6 Drawing Sheets

METHOD FOR MANUFACTURING SEMICONDUCTOR DEVICE AND SEMICONDUCTOR DEVICE

CROSS-REFERENCE TO RELATED APPLICATIONS

This application is based upon and claims priority to Japanese Patent Application No. 2018-058967, filed on Mar. 26, 2018, and Japanese Patent Application No. 2018-178761, filed on Sep. 25, 2018; the entire contents of which are incorporated herein by reference.

FIELD

Embodiments described herein relate generally to a semiconductor device and a method for manufacturing the same.

BACKGROUND

For a semiconductor device such as a light-emitting element or the like, a semiconductor layer is grown on, for example, a wafer such as a sapphire substrate or the like. There are cases where cracks occur in the semiconductor layer and reduce yield. It is desirable to increase productivity.

SUMMARY

According to one embodiment, a method for manufacturing a semiconductor device includes preparing a wafer including sapphire and forming a semiconductor layer at an upper surface of the wafer; the upper surface includes a first region, and a second region provided to surround the first region; the second region is provided at a position at least 2 µm higher or lower than the first region; and the semiconductor layer includes an Al-including layer including $Al_zGa_{1-z}N$ (0.03≤z≤0.15).

According to another embodiment, a method for manufacturing a semiconductor device includes preparing a wafer including sapphire and forming a semiconductor layer at an upper surface of the wafer; the upper surface includes a first region, a second region provided around the first region, and a trench provided to surround the first region between the first region and the second region; a depth of the trench is 2 µm or more; and the semiconductor layer includes an Al-including layer including $Al_zGa_{1-z}N$ (0.03≤z≤0.15).

According to another embodiment, a semiconductor device includes a wafer and a semiconductor layer; the wafer has an upper surface and includes sapphire; the upper surface includes a first region, and a second region provided to surround the first region; the second region is provided at a position at least 2 µm higher or lower than the first region; and the semiconductor layer is provided at the upper surface and includes an Al-including layer including $Al_zGa_{1-z}N$ (0.03≤z≤0.15).

According to another embodiment, a semiconductor device includes a wafer and a semiconductor layer; the wafer has an upper surface and includes sapphire; the upper surface includes a first region, a second region provided around the first region, and a trench provided to surround the first region between the first region and the second region; a depth of the trench is 2 µm or more; and the semiconductor layer is provided at the upper surface and includes an Al-including layer including $Al_zGa_{1-z}N$ (0.03≤z≤0.15).

DETAILED DESCRIPTION

Various embodiments are described below with reference to the accompanying drawings.

The drawings are schematic and conceptual, and the relationships between the thickness and width of portions, the proportions of sizes among portions, etc., are not necessarily to scale. The dimensions and proportions may be illustrated differently among drawings, even for identical portions.

In the specification and drawings, components similar to those described previously or illustrated in an previous drawing are marked with like reference numerals, and a detailed description is omitted as appropriate.

First Embodiment

Figure 1:
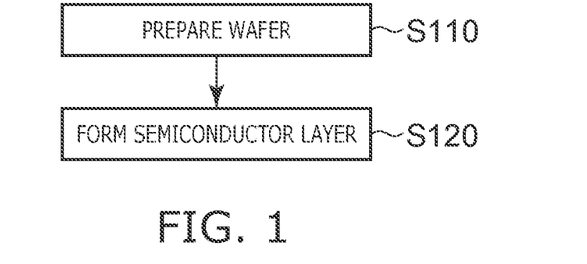
FIG. 1 is a flowchart illustrating a method for manufacturing a semiconductor device according to an embodiment.

FIG. 1 is a flowchart illustrating a method for manufacturing a semiconductor device according to a first embodiment.

As shown in FIG. 1, the method for manufacturing the semiconductor device according to the first embodiment includes a process of preparing a wafer (step S110) and a process of forming a semiconductor layer (step S120). An example of the wafer will now be described.

Figure 2:
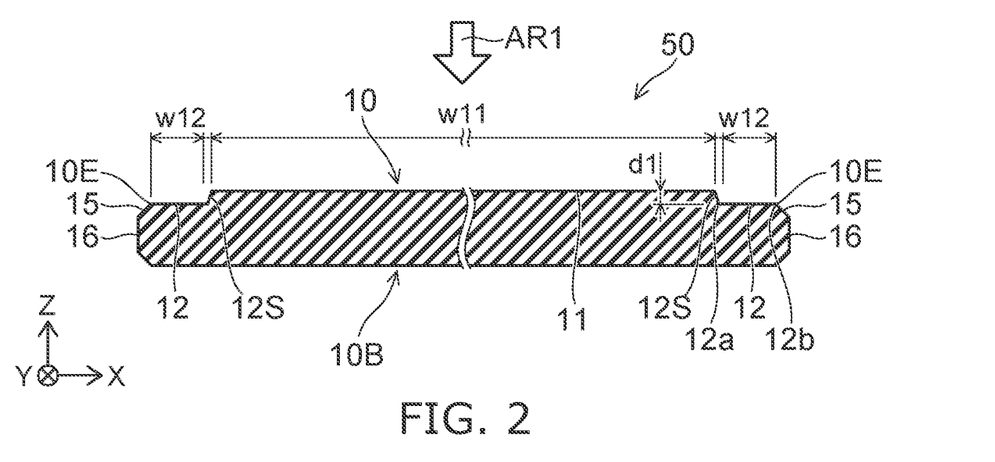
FIG. 2 is a schematic cross-sectional view illustrating a wafer used in the method for manufacturing the semiconductor device according to the embodiment.
Figure 3:
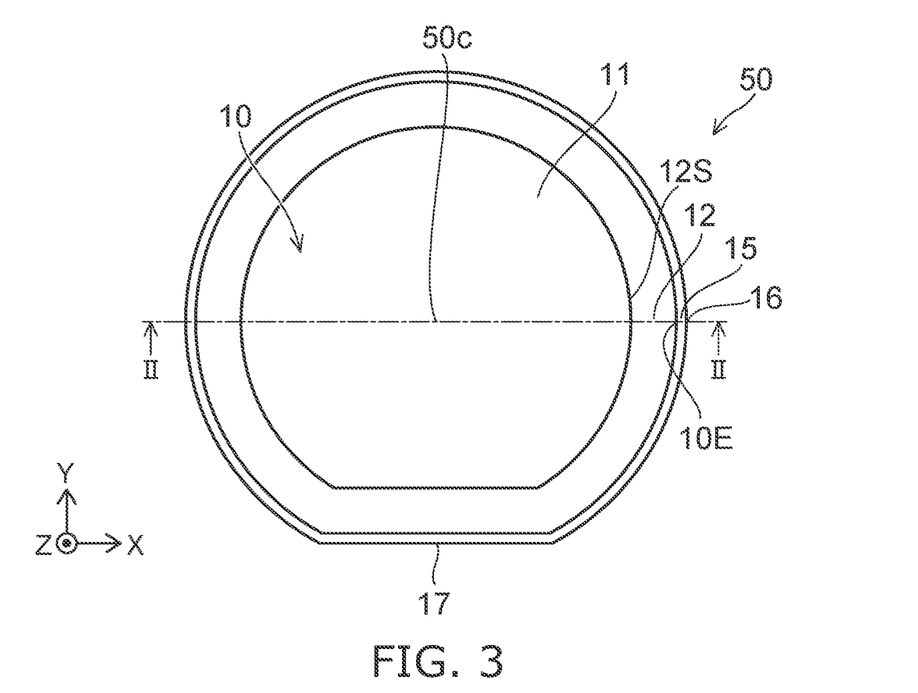
FIG. 3 is a schematic cross-sectional view illustrating a wafer used in the method for manufacturing the semiconductor device according to the embodiment.

FIG. 2 and FIG. 3 are schematic cross-sectional views illustrating the wafer used in the method for manufacturing the semiconductor device according to the first embodiment.

FIG. 2 is a line II-II cross-sectional view of FIG. 3. FIG. 3 is a plan view as viewed along arrow AR1 of FIG. 2.

As shown in FIG. 2, the wafer 50 has an upper surface 10 (e.g., a first surface) and a lower surface 10B (e.g., a second surface). For example, a direction perpendicular to the upper surface 10 is taken as a Z-axis direction. One direction perpendicular to the Z-axis direction is taken as an X-axis direction. A direction perpendicular to the Z-axis direction and the X-axis direction is taken as a Y-axis direction. The upper surface 10 and the lower surface 10B are along the X-Y plane.

The wafer 50 functions as a substrate for growing a semiconductor layer. The wafer 50 is, for example, a sapphire substrate. For example, the wafer 50 includes sapphire. In one example, the upper surface 10 is substantially aligned with the c-plane of the sapphire. In the present application, the phrase "the upper surface 10 is substantially aligned with the c-plane of the sapphire" means that the angle between the upper surface 10 and the c-plane of the sapphire is, for example, degrees or less. Thus, the upper surface 10 may be tilted with respect to the c-plane.

An outer end 16 of the wafer 50 is a region inside the wafer 50 positioned on the outermost side. For example, the outer end 16 of the wafer 50 crosses the X-Y plane. A bevel portion 15 is provided in the wafer 50 at the vicinity of the outer end 16. The surface of the bevel portion 15 is tilted with respect to the X-Y plane (e.g., a first region 11). The thickness (the length along the Z-axis direction) of the bevel portion 15 increases inward from the outer end 16.

In the first embodiment, the upper surface 10 is a portion other than the bevel portion 15. For example, the bevel portion 15 is provided around the upper surface 10 in the X-Y plane.

As shown in FIG. 3, the outer end 16 of the wafer 50 is, for example, substantially circular. An orientation flat 17 is provided in a portion of the wafer 50. As shown in FIG. 3, the bevel portion 15 is provided in a ring configuration on the inner side of the outer end 16. The upper surface 10 is provided on the inner side of the bevel portion 15. An outer edge 10E of the upper surface 10 is provided to be continuous with the bevel portion 15. Other than the portion corresponding to the orientation flat 17, for example, the outer edge 10E is substantially circular.

As shown in FIG. 2 and FIG. 3, the upper surface 10 includes the first region 11 and a second region 12. The first region 11 includes a center 50c of the wafer 50 (referring to FIG. 3). The first region 11 is an inner region positioned inward in the wafer 50.

As shown in FIG. 3, the second region 12 is provided around the first region 11. For example, the second region 12 is provided to surround the first region 11. The second region 12 is an outer perimeter region.

As shown in FIG. 2, for example, the first region 11 and the second region 12 are substantially parallel to each other. For example, the first region 11 and the second region 12 are along the X-Y plane. In this application, the phrase "the first region 11 and the second region 12 are substantially parallel to each other" means that the absolute value of the angle between the second region 12 and a plane including the first region 11 is, for example, 5 degrees or less.

The second region 12 is provided at a position higher than the first region 11 or lower than the first region 11. In the example shown in FIG. 2, the second region 12 is provided at a low position with respect to the first region 11. For example, the distance (a first distance) along the Z-axis direction between the first region 11 and a plane including the lower surface 10B is longer than the distance (a second distance) along the Z-axis direction between the second region 12 and the plane including the lower surface 10B.

The difference (a level difference d1) between the height (the position in the Z-axis direction) of the first region 11 and the height (the position in the Z-axis direction) of the second region 12 is 2 µm or more. The level difference d1 is the length along the Z-axis direction. The level difference d1 corresponds to the distance along the Z-axis direction between the second region 12 and the plane including the first region 11. The difference between the first distance and the second distance corresponds to the level difference d1.

In the example, a level-difference portion 12S is provided between the first region 11 and the second region 12. The height (or the depth) of the level-difference portion 12S corresponds to the level difference d1. In one example, the upper surface 10 includes the first region 11, the second region 12, and the level-difference portion 12S.

The second region 12 includes an inner end portion 12a. The inner end portion 12a is the end on the first region 11 side. In the example, an outer end portion 12b of the second region 12 is positioned at the same portion as the outer edge 10E of the upper surface 10. In the second region 12, the distance between the inner end portion 12a and the outer edge 10E is taken as a width w12 of the second region 12. The width w12 corresponds to the distance between the inner end portion 12a and the outer edge 10E along a straight line passing through the center 50c of the wafer 50 (referring to FIG. 3). The center 50c of the wafer 50 is the center of the wafer 50 for a virtual circular configuration of the wafer 50 when viewed in the top view.

A width w11 of the first region 11 corresponds to the length of the first region 11 along a straight line passing through the center 50c of the wafer 50. The width w12 is narrower than the width w11. The width w12 is, for example, not less than 2.0 mm and not more than 10 mm; and the width w11 is, for example, not less than 5 mm and not more than 300 mm.

For example, the second region 12 such as that described above can be formed by forming a mask on the upper surface of the original wafer and by performing first wet etching to remove part of the portion of the upper surface of the wafer not covered with the mask. The mask covers the portion of the upper surface of the original wafer recited above used to form the first region 11 and leaves exposed the portion used to form the second region 12. Further, second wet etching may be performed after the first wet etching. The second wet etching processes the surface of the wafer 50 where the mask formed for the first wet etching is removed. The residue of the mask and the like are removed at the surface of the first region 11 and the surface (the bottom surface) of the second region 12 that are obtained. These surfaces become flatter. The etching rate of the wafer in the second wet etching lower than the etching rate of the wafer in the first wet etching. The mask includes, for example, a material including $SiO_2$.

A semiconductor layer 20 is formed at such an upper surface 10 of the wafer 50 including the first region 11 and the second region 12 (step S120 (referring to FIG. 1)). An example of the formation of the semiconductor layer 20 will now be described.

Figure 4:
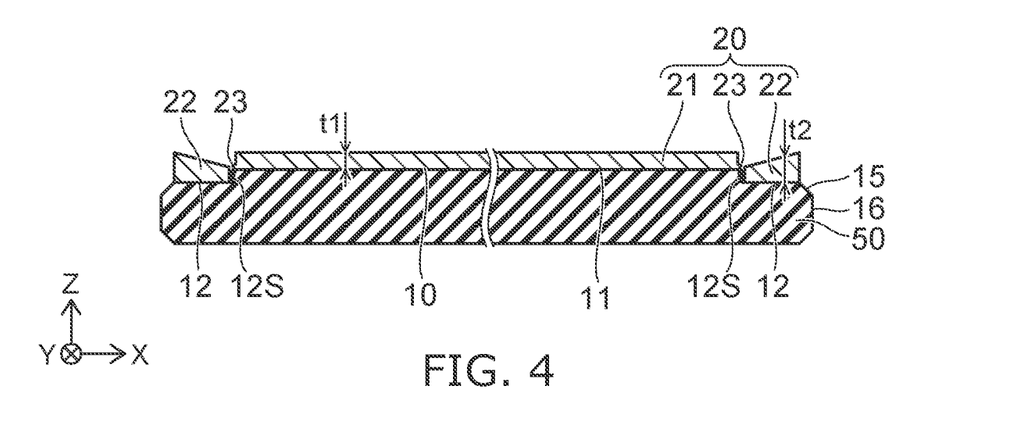
FIG. 4 is a schematic cross-sectional view illustrating a portion of the method for manufacturing the semiconductor device according to the embodiment.
Figure 5:
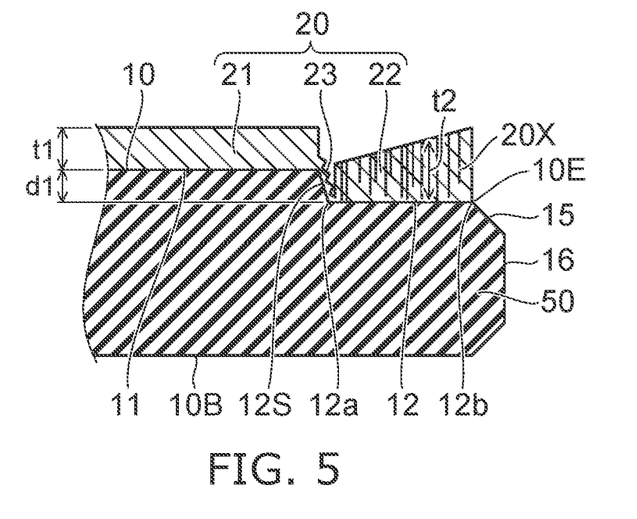
FIG. 5 is a schematic cross-sectional view illustrating a portion of the method for manufacturing the semiconductor device according to the embodiment.

FIG. 4 and FIG. 5 are schematic cross-sectional views illustrating a portion of the method for manufacturing the semiconductor device according to the first embodiment.

FIG. 5 shows an enlarged portion of FIG. 4.

As shown in FIG. 4 and FIG. 5, the semiconductor layer is formed at the upper surface 10 of the wafer 50. The formation of the semiconductor layer 20 is performed by MOCVD (metal organic chemical vapor deposition), etc. The crystal that is used to form the semiconductor layer 20 is epitaxially grown.

The semiconductor layer 20 includes a first semiconductor region 21 and a second semiconductor region 22. The first semiconductor region 21 is provided in the first region 11 of the upper surface 10. The second semiconductor region 22 is provided in the second region 12 of the upper surface 10.

As shown in FIG. 5, a level difference (a difference of height) is provided between the first region 11 and the second region 12. Therefore, the first semiconductor region 21 and the second semiconductor region 22 are discontinuous. Therefore, even in the case in which cracks 20X occur in the second semiconductor region 22, the cracks 20X that occur in the second semiconductor region 22 are suppressed from extending into the first semiconductor region 21. As a result, defects of the semiconductor layer 20 caused by cracks in the first semiconductor region 21 are suppressed. According to the first embodiment, the productivity can be increased. In FIG. 5, the cracks 20X extend in the thickness direction of the semiconductor layer 20. In the first embodiment, the direction in which the cracks 20X extend is arbitrary. For example, there are also cases where the cracks 20X that occur in the semiconductor layer 20 extend in the X-axis direction shown in FIG. 4.

There is a first reference example in which the second region 12 is not provided in the upper surface 10 of the wafer 50. In the first reference example, the upper surface 10 has only one height. It was found that in such a case, if the cracks 20X occur in the region of the semiconductor layer 20 at the vicinity of the bevel portion 15, cracks that have the cracks 20X as starting points extend easily into the inner region. For the first reference example, it is considered that the cracks 20X extend easily into the inner region from the region at the vicinity of the bevel portion 15 because the semiconductor layer is continuous between the inner region and the region at the vicinity of the bevel portion 15.

Conversely, in the first embodiment, the first semiconductor region 21 and the second semiconductor region 22 that are formed by crystal growth on the first region 11 and the second region 12 are discontinuous due to the level difference (the difference of height) between the regions. Therefore, even in the case in which the cracks 20X occur in the second semiconductor region 22, the extension of the cracks 20X into the first semiconductor region 21 is suppressed.

For example, by inspecting after the formation of the semiconductor layer 20, it was found that the defect rate of the first embodiment can be 0.4 times the defect rate of the first reference example recited above or less.

In the example as shown in FIG. 4 and FIG. 5, a third semiconductor region 23 is formed at the level-difference portion 12S of the wafer 50. For example, in the case in which the upper surface 10 is aligned with the c-plane of the sapphire, the plane orientations of the first region 11 and the second region 12 are substantially the same c-plane of the sapphire. Conversely, the plane orientation of the surface of the level-difference portion 12S is different from the plane orientations of the first region 11 and the second region 12. Therefore, it is considered that the semiconductor layer 20 is substantially not epitaxially grown in the third semiconductor region 23. At the upper surface 10, the semiconductor layer is epitaxially grown mainly in the first region 11 and the second region 12. In the case in which the third semiconductor region 23 is formed, the discontinuity between the first semiconductor region 21 and the second semiconductor region 22 is higher. Therefore, the extension of the cracks 20X of the second semiconductor region 22 into the first semiconductor region 21 is suppressed further. Thereby, the productivity can be increased.

According to investigations by the inventor, it was found that abnormalities occur easily in the semiconductor layer 20 at the outer perimeter portion (e.g., the vicinity of the bevel portion 15) of the wafer 50. For example, it was found that the thickness of the semiconductor layer 20 growing at the outer perimeter portion of the wafer 50 easily becomes thicker than the thickness of the semiconductor layer 20 growing at the inner portion. Also, the cracks 20X occur easily in the semiconductor layer 20 growing at the outer perimeter portion of the wafer 50. It was found that such a tendency is particularly pronounced in the case in which the semiconductor layer 20 that is grown is a nitride semiconductor including Al.

For example, as shown in FIG. 5, a thickness t1 of the first semiconductor region 21 grown on the first region 11 is substantially constant in the first semiconductor region 21. Conversely, there is a tendency for a thickness t2 of the second semiconductor region 22 grown on the second region 12 to be thicker than the thickness t1. Also, there is a tendency for the thickness t2 of the second semiconductor region 22 to enlarge in the direction from the inner region (the first semiconductor region 21) toward the outer end 16. Further, the cracks 20X easily occur more markedly in the second semiconductor region 22 than in the first semiconductor region 21. It is considered that such a unique state of the second semiconductor region 22 is affected by, for example, unintended growth of the semiconductor layer 20 at the vicinity of the outer end 16 of the wafer 50.

The first region 11 and the second region 12 are provided in the upper surface 10 of the wafer 50 for the wafer 50 according to the first embodiment. A level difference is provided between these regions. Thereby, even in the case in which the semiconductor layer 20 to be formed is a nitride semiconductor including Al, the extension into the first semiconductor region 21 of the cracks 20X occurring in the second semiconductor region 22 can be suppressed effectively. According to the first embodiment, a method for manufacturing a semiconductor device can be provided in which the productivity can be increased.

The second semiconductor region 22 that is formed in the second region 12 is a portion that is removed and discarded after the formation of the semiconductor layer 20. The first semiconductor region 21 that is formed in the first region 11 is used as the semiconductor devices. In the case in which the surface area of the second semiconductor region 22 is excessively large, the number of semiconductor devices obtained from one wafer 50 decreases; and the productivity decreases. Therefore, it is favorable for the width of the second semiconductor region 22 to be narrow within a range in which the extension of the cracks 20X can be suppressed.

According to investigations by the inventor, it was found that the width (the distance from the bevel portion 15) of the region of the semiconductor layer 20 grown on the outer perimeter portion of the wafer 50 where the cracks 20X occur easily is about 10 mm or less.

In the first embodiment, it is favorable for the width w12 of the second region 12 to be not less than 2.0 mm and not more than 10 mm. By setting the width w12 to be 2.0 mm or more, the effect of the cracks 20X not occurring easily in the first semiconductor region 21 is obtained stably. Also, even when the cracks 20X occur in the second semiconductor region 22, the extension into the first semiconductor region 21 of the cracks 20X occurring in the second semiconductor region 22 can be suppressed effectively by the level difference. By setting the width w12 to be 10 mm or less, the second region 12 which is not used as the semiconductor device can be small. The effective surface area of the first region 11 can be large; and high productivity is obtained.

In the example as shown in FIG. 2, the second region 12 reaches the outer edge 10E of the upper surface 10. For example, the second region 12 is provided to be continuous from the inner end portion 12a of the second region 12 to the outer edge 10E. The second region 12 is along the X-Y plane. For example, a crystal that is similar to that of the first region 11 is obtained in such a second region 12. Thereby, the semiconductor layer 20 can be grown effectively on the second region 12; and the semiconductor layer in which unintended growth occurs can be concentrated in the second semiconductor region 22 that is formed.

For example, there is a second reference example in which surface roughening is performed at the outer perimeter portion (the region at the vicinity of the bevel portion 15) of a silicon substrate. A fine unevenness is provided by the surface roughening. In the second reference example, the arithmetic average roughness Ra of the surface of the outer perimeter region is caused to be larger than the arithmetic average roughness Ra of the surface of the inner portion (corresponding to the first region 11). The arithmetic average roughness Ra in the outer perimeter region is, for example, about 230 nm; and the arithmetic average roughness Ra of the inner portion is, for example, about 2.1 nm. In such a second reference example, the semiconductor layer 20 that is grown in the outer perimeter portion (the region at the vicinity of the bevel portion 15) is a polycrystal. Generally, when a nitride semiconductor is formed on a silicon substrate, cracks occur easily at the wafer end portion due to the differences between the thermal expansion coefficients and the lattice constants. Such cracks can be suppressed by the surface roughening.

It also may be considered to perform surface roughening such as that of the second reference example on a sapphire substrate. In such a case, a polycrystal is grown at the outer perimeter portion due to the surface roughening. On the other hand, a substantially single crystal is grown at the inner perimeter portion. Thus, in the second reference example, the characteristics of the films that are grown are much different between the inner perimeter portion and the outer perimeter portion. Therefore, for example, for the semiconductor layer grown on the inner portion, the characteristics of the semiconductor layer 20 easily become different between the central region and the region proximal to the outer perimeter portion due to the surface roughening. Accordingly, in the second reference example, the uniformity of the semiconductor layer 20 at the inner perimeter portion easily becomes insufficient.

Conversely, in the first embodiment, for example, the surface of the second region 12 is similar to the surface of the first region 11 other than the height. Therefore, there are substantially no effects on the first semiconductor region 21 formed in the first region 11 due to the second region 12 being provided. Uniform characteristics can be obtained easily in the first semiconductor region 21.

Electrodes, etc., are formed on the semiconductor layer after the semiconductor layer 20 is formed on the upper surface 10 of the wafer 50. There are cases where the wafer 50 is removed subsequently. For example, the removal is performed by LLO (laser lift-off) processing, etc. In the case of the second reference example recited above, the surface roughening is provided in the region at the vicinity of the bevel portion 15; therefore, the laser light that is irradiated in the LLO processing is scattered by the portion of the surface roughening (the unevenness); and it is difficult to condense the light. Therefore, in the second reference example, it is difficult to efficiently perform the LLO processing.

Conversely, in the first embodiment, the flatness of the surface of the second region 12 is high. Therefore, the scattering by the second region 12 of the laser light in the LLO processing is suppressed. In the first embodiment, the LLO processing can be performed efficiently.

In the first embodiment, for example, the arithmetic average roughness Ra of the second region 12 may be similar to the arithmetic average roughness Ra of the first region 11.

For example, the arithmetic average roughness Ra of the first region 11 is not less than 0.05 nm and not more than 0.3 nm, and favorably not less than 0.1 nm and not more than 0.2 nm. The arithmetic average roughness Ra of the second region 12 is not less than 0.05 nm and not more than 0.3 nm, and favorably not less than 0.1 nm and not more than 0.2 nm.

As described above, in the case in which the semiconductor layer 20 includes Al, an unintended state (e.g., abnormalities of the thickness and/or a concentrated occurrence of the cracks 20X) occurs easily in the semiconductor layer 20 at the outer perimeter portion (e.g., the vicinity of the bevel portion 15) of the wafer 50. Such a phenomenon is particularly pronounced in the case in which the composition ratio of Al of the semiconductor layer 20 is high (e.g., including a layer including AlGaN). When AlGaN which has a high composition ratio of Al is grown, for example, there is a tendency for the Al concentration (the composition ratio) in the outer perimeter region of the wafer 50 to be higher than the Al concentration in the inner region of the wafer 50. For this reason as well, it is estimated that abnormalities occur in the AlGaN and unintended growth occurs in the outer perimeter region of the wafer 50. In such a case, the extension of the cracks 20X can be suppressed effectively by the second region 12 according to the first embodiment. For example, the occurrence of the cracks 20X from the outer perimeter portion toward the inner perimeter portion of the wafer 50 can be suppressed. Thereby, the semiconductor device (e.g., the light-emitting device) can be manufactured with a high yield.

In the first embodiment, it is favorable for the second region 12 to be positioned at a position that is lower than the first region 11. For example, the source gas flows along the upper surface 10 when forming the semiconductor layer 20 at the upper surface 10 of the wafer 50. Turbulence of the flow of the gas can be suppressed by positioning the second region 12 at a position that is lower than the first region 11.

An example in which the semiconductor layer 20 includes a nitride semiconductor including Al will now be described.

Figure 6:
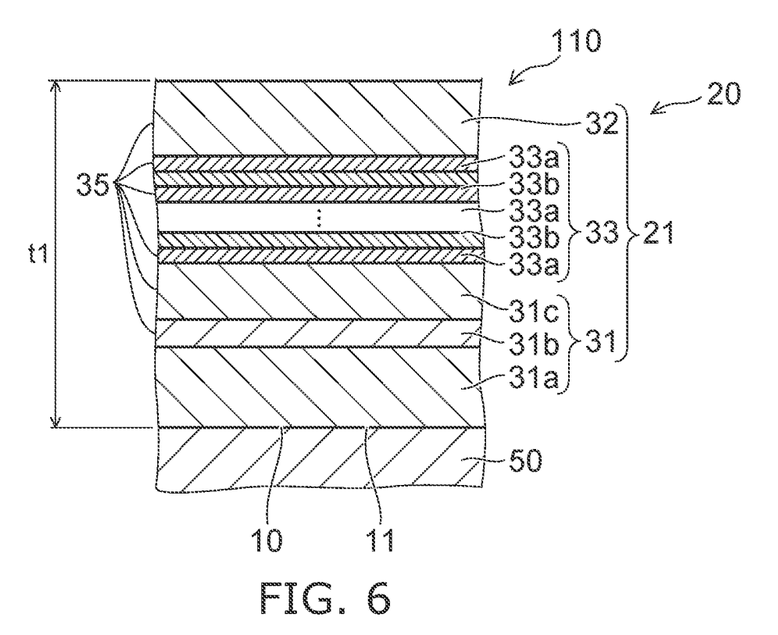
FIG. 6 is a schematic cross-sectional view illustrating the semiconductor device according to the embodiment.

FIG. 6 is a schematic cross-sectional view illustrating the semiconductor device according to the first embodiment.

As shown in FIG. 6, the semiconductor layer 20 (the first semiconductor region 21) is provided on the first region 11 of the upper surface 10 of the wafer 50. The semiconductor layer is used to form at least a portion of the semiconductor device 110. In the example, the semiconductor device 110 is a light-emitting device (e.g., an LED or a LD). The semiconductor device 110 may include the wafer 50.

The semiconductor layer 20 includes, for example, a first semiconductor film 31, a light-emitting layer 33, and a second semiconductor film 32. The light-emitting layer 33 is provided on the first semiconductor film 31. The second semiconductor film 32 is provided on the light-emitting layer 33.

The first semiconductor film 31 includes a first film 31a including undoped GaN, a second film 31b including undoped AlGaN and provided on the first film 31a, and a third film 31c provided on the second film 31b and including AlGaN doped with Si as an impurity. The first semiconductor film 31 functions as an n-type semiconductor layer. The light-emitting layer 33 includes, for example, a barrier film 33a including AlGaN and a well film 33b including InGaN that are stacked alternately. For example, the barrier film 33a and the well film 33b are taken as one set; and three to five sets are provided. In the light-emitting layer 33 of the example, other than the sets of the barrier films 33a and the well films 33b, the barrier film 33a is further provided on the side most proximal to the second semiconductor film 32. The second semiconductor film 32 includes, for example, AlGaN doped with Mg as an impurity. The second semiconductor film 32 functions as a p-type semiconductor layer.

For example, the Al composition ratios (the proportions of Al among the Group III elements) of the second film 31b and the third film 31c which include Al are, for example, not less than 3% (atomic %) and not more than 8% (atomic %). For example, the second film 31b and the third film 31c include $Al_{x1}Ga_{1-x1}N$ ($0.03 \le x1 \le 0.08$).

For example, the Al composition ratio (the proportion of Al among the Group III elements) of the barrier film 33a is, for example, not less than 3% (atomic %) and not more than 15% (atomic %) (e.g., about 10%). For example, the barrier film 33a includes $Al_{x3}Ga_{1-x3}N$ ($0.03 \le x3 \le 0.15$).

For example, the Al composition ratio (the proportion of Al among the Group III elements) of the second semiconductor film 32 is, for example, not less than 3% (atomic %) and not more than 10% (atomic %) (e.g., about 7%). For example, the second semiconductor film 32 includes $Al_{x2}Ga_{1-x2}N$ ($0.03 \le x2 \le 0.10$).

Thus, the semiconductor layer 20 includes an Al-including layer 35. The Al-including layer 35 includes a nitride semiconductor including Al. In the example, the Al-including layer 35 includes the second film 31b, the third film 31c, the barrier films 33a, and the second semiconductor film 32.

The proportion of Al among the Group III elements of the Al-including layer 35 is not less than 3% (atomic %) and not more than 15% (atomic %).

The thickness of the Al-including layer 35 is taken as the total thickness of the multiple AlGaN films included in the Al-including layer 35. The thickness of the Al-including layer is, for example, not less than 20% and not more than 40% of the total film thickness of the semiconductor layer 20 (the thickness t1). In the description recited above, the "thickness" is the length along the Z-axis direction.

For example, the thickness of the first film 31a is about 6.5 μm. For example, the thickness of the second film 31b is about 0.05 μm. The thickness of the third film 31c is about 2 μm. Accordingly, the total thickness of the second film 31b and the third film 31c is about 2 μm. For example, the total thickness of the barrier films 33a is about 0.15 μm. For example, the thickness of the second semiconductor film 32 is about 0.18 μm.

Accordingly, the thickness of the Al-including layer 35 (the total thickness of the multiple AlGaN films included in the Al-including layer 35) is about 2.3 μm. On the other hand, the total film thickness of the semiconductor layer 20 (the thickness t1) is about 9 μm. Accordingly, in one example, the thickness of the Al-including layer 35 is about 25% of the thickness t1.

A portion (e.g., the second film 31b and the third film 31c) of the Al-including layer 35 is positioned between the light-emitting layer 33 and the wafer 50. The Al composition ratio of the portion of the Al-including layer 35 positioned between the light-emitting layer 33 and the wafer 50 is, for example, not less than 3% and not more than 8%. The portion of the Al-including layer 35 positioned between the light-emitting layer 33 and the wafer 50 includes $Al_{x1}$ $Ga_{1-x1}N$ ($0.03 \le x1 \le 0.08$). The entire Al-including layer 35 may be positioned between the light-emitting layer 33 and the wafer 50.

The portion of the Al-including layer 35 positioned between the light-emitting layer 33 and the wafer 50 may be considered to be the third film 31c. Even in such a case, the Al composition ratio of the portion of the Al-including layer 35 positioned between the light-emitting layer 33 and the wafer 50 is, for example, not less than 3% and not more than 8%. The portion of the Al-including layer 35 positioned between the light-emitting layer 33 and the wafer 50 includes $Al_{x1}Ga_{1-x1}N$ ($0.03 \le x1 \le 0.08$).

Even in such a case, the thickness of the portion of the Al-including layer 35 positioned between the light-emitting layer 33 and the wafer 50 is substantially not less than 20% and not more than 40%.

In the first embodiment, the peak wavelength of the light emitted from the light-emitting layer 33 is not less than 330 nm and not more than 400 nm. In one example, the peak wavelength is about 365 nm. In another example, the peak wavelength is about 385 nm.

In the case in which the peak wavelength of the light emitted from the light-emitting layer 33 is not less than 330 nm and not more than 400 nm, if a portion of the Al-including layer is a semiconductor layer including, for example, GaN that does not include Al, the light that is emitted from the light-emitting layer 33 is absorbed easily by the portion of the Al-including layer 35. By setting the composition ratio of Al of the portion of the Al-including layer 35 to be high, a high transmittance for the light emitted from the light-emitting layer 33 is obtained.

For example, the portion of the Al-including layer 35 positioned between the light-emitting layer 33 and the wafer 50 includes the third film 31c. For example, the third film 31c functions as a contact layer where an n-side electrode or the like is provided. To obtain the appropriate spreading of the current, the third film 31c is set to be relatively thick (e.g., about 2 μm). In such a case, even when the third film 31c including a high composition ratio of Al is provided, the extension of the cracks 20X can be suppressed effectively by providing the second region 12 having a height that is different from that of the first region 11.

Another example in which the semiconductor layer 20 includes a nitride semiconductor including Al will now be described.

The semiconductor layer 20 includes the Al-including layer 35. The Al-including layer 35 includes a nitride semiconductor including Al.

The proportion of Al among the Group III elements of the Al-including layer 35 is not less than 50% (atomic %), and favorably not less than 70% (atomic %). For example, the Al-including layer 35 includes $Al_xGa_{1-x}N$ ($0.5 \le x \le 1$).

The thickness of the Al-including layer 35 is taken as the total thickness of the multiple AlGaN films and AlN films included in the Al-including layer 35. The thickness of the Al-including layer 35 is, for example, 70% or more of the total film thickness of the semiconductor layer 20 (the thickness t1), and favorably 80% or more of the total film thickness. In the description recited above, the "thickness" is the length along the Z-axis direction.

In the first embodiment, the peak wavelength of the light emitted from the light-emitting layer 33 is not less than 250 nm and not more than 330 nm. In one example, the peak wavelength is about 270 nm. In another example, the peak wavelength is about 280 nm.

In the first embodiment, it is favorable for the level difference d1 between the first region 11 and the second region 12 to be, for example, not less than the thickness of the third film 31c.

Figure 7:
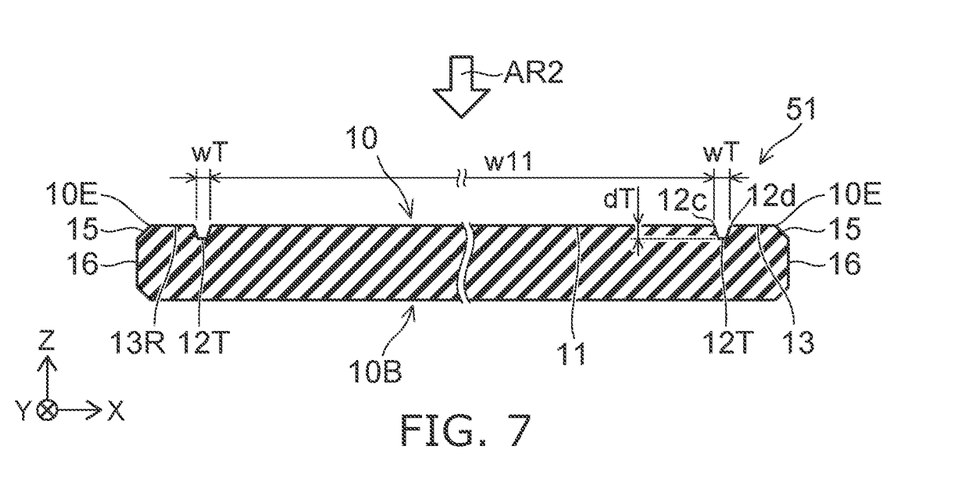
FIG. 7 is a schematic view illustrating another wafer used in the method for manufacturing the semiconductor device according to the embodiment.
Figure 8:
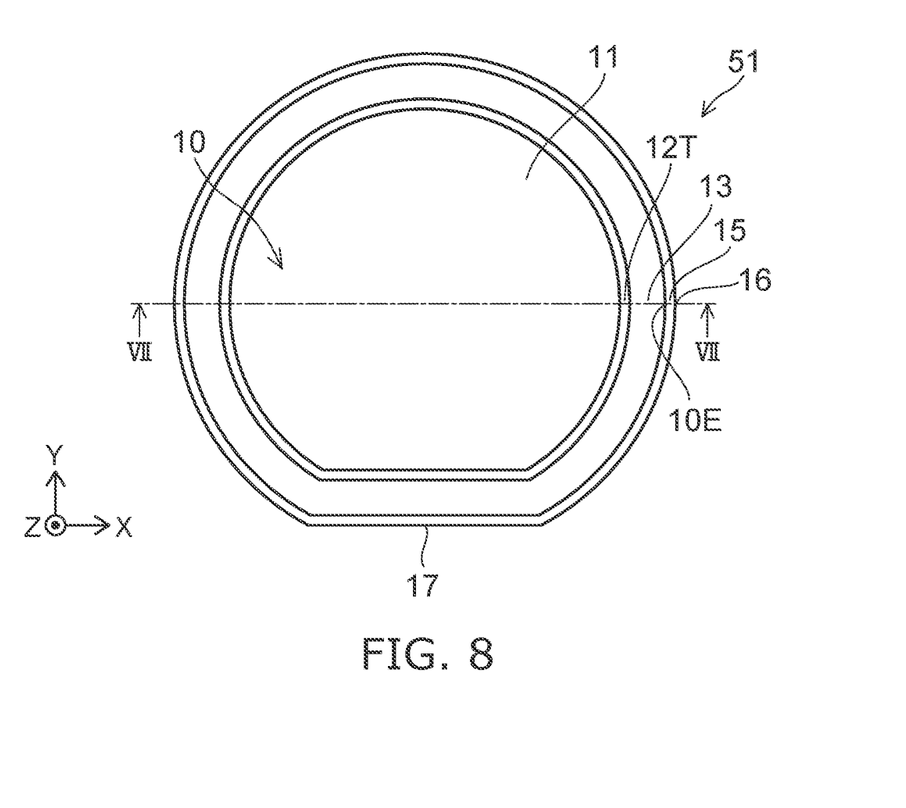
FIG. 8 is a schematic view illustrating another wafer used in the method for manufacturing the semiconductor device according to the embodiment.

FIG. 7 and FIG. 8 are schematic views illustrating another wafer used in the method for manufacturing the semiconductor device according to the first embodiment.

FIG. 7 is a line VII-VII cross-sectional view of FIG. 8. FIG. 8 is a plan view as viewed along arrow AR2 of FIG. 7.

In another wafer 51 according to the first embodiment shown in FIG. 7 and FIG. 8, the upper surface 10 of the wafer 51 includes a trench 12T. For example, the upper surface 10 includes the first region 11, the trench 12T, and a second region 13. The trench 12T is provided between the first region 11 and the second region 13. The trench 12T is provided around the first region 11. For example, the trench 12T surrounds the first region 11. The second region 13 is provided around the trench 12T. The trench 12T includes an inner end portion 12c. The inner end portion 12c is the end on the first region 11 side. The trench 12T includes an outer end portion 12d. The outer end portion 12d is the end on the second region 12 side. The trench 12T includes a level-difference portion between the inner end portion 12c and the bottom portion and a level-difference portion between the outer end portion 12d and the bottom portion. The inner end portion 12c is the end on the first region 11 side. The trench 12T is the region of the upper surface 10 from the inner end portion 12c to the outer end portion 12d. In the second region 13, the distance between the inner end portion of the second region 13 (the outer end portion 12d of the trench 12T) and the outer edge 10E of the upper surface 10 is taken as the width of the second region 13.

A depth dT of the trench 12T is, for example, 2 μm or more. The depth dT is the distance in the Z-axis direction between the position in the Z-axis direction of the upper surface of the first region 11 and the position in the Z-axis direction of the bottom portion of the trench 12T. The bottom portion of the trench 12T may include a region along the X-Y plane. The trench 12T may not include a region along the X-Y plane. For example, the trench 12T may have a "V-shape." It is favorable for a width wT of the bottom portion of the trench 12T (referring to FIG. 7) to be, for example, not less than 10 μm and not more than 100 μm.

The semiconductor layer 20 (referring to FIG. 4) is formed at the upper surface 10 having such a configuration. The semiconductor layer 20 includes, for example, the Al-including layer 35. In the other wafer 51, the semiconductor layer 20 is epitaxially grown mainly in the first region 11 and the second region 13 of the upper surface 10.

In the wafer 51 as well, even in the case in which the cracks 20X occur in the second semiconductor region 22, the extension into the first semiconductor region 21 of the cracks 20X occurring in the second semiconductor region 22 is suppressed. The defects that are caused by the cracks in the first semiconductor region 21 are suppressed. In the wafer 51 as well, the productivity can be increased.

In the wafer 51 as well, for example, the second region 12 can be formed by wet etching, etc. (the first wet etching and the second wet etching recited above). For example, the second region 12 can be formed by forming a mask to cover the first region 11 and the second region 13 of the upper surface 10 of the wafer 51 and to leave the second region 12 exposed, and by removing a portion of the exposed portion by the first wet etching.

It is favorable for the width of the second region 13 to be, for example, not less than 2.0 mm and not more than 10 mm.

By setting the width of the second region 13 to be 2.0 mm or more, the effect of the cracks 20X not occurring easily in the portion of the semiconductor layer 20 on the first region 11 (the first semiconductor region 21 referring to FIG. 7) is obtained stably. Also, even in the case in which the cracks 20X occur in the region of the semiconductor layer 20 on the second region 13, the extension into the first semiconductor region 21 of the cracks 20X that occur can be suppressed effectively by the trench 12T. By setting the width of the second region 13 to be 10 mm or less, the second region 13 that is not used as the semiconductor device can be small. The effective surface area of the first region 11 can be large; and high productivity is obtained.

Figure 9:
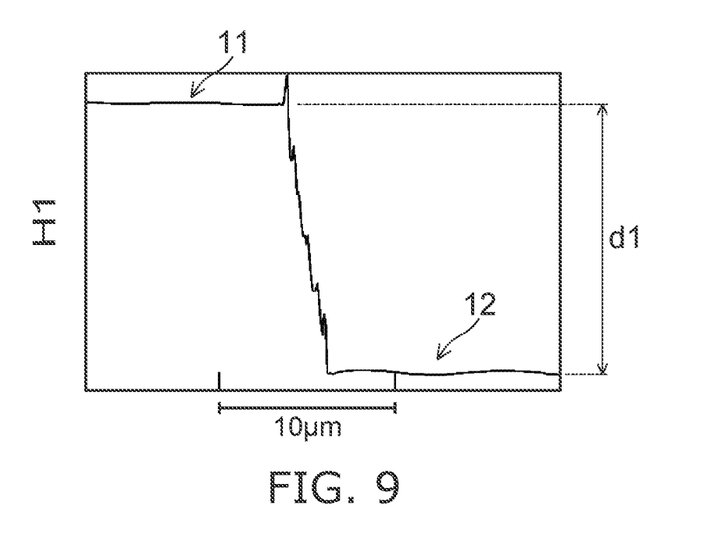
FIG. 9 is a graph illustrating a wafer used in the method for manufacturing the semiconductor device according to the embodiment.
Figure 10:
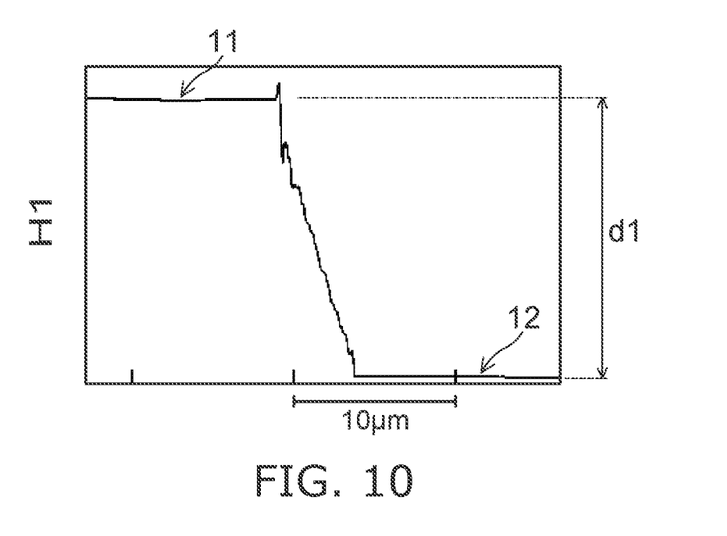
FIG. 10 is a graph illustrating a wafer used in the method for manufacturing the semiconductor device according to the embodiment.
Figure 11:
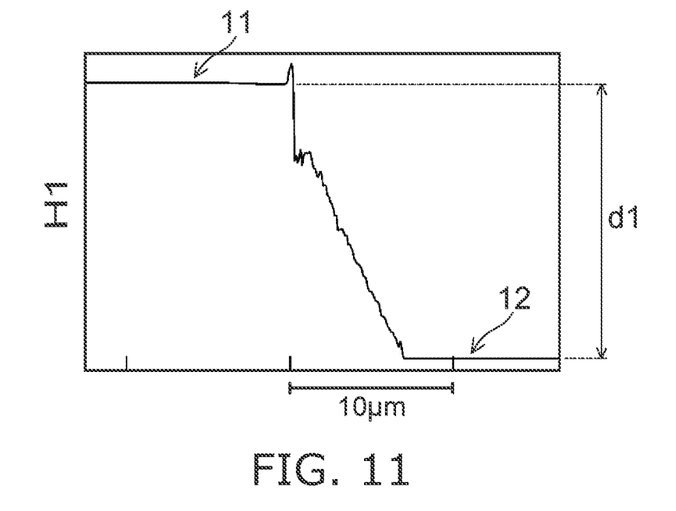
FIG. 11 is a graph illustrating a wafer used in the method for manufacturing the semiconductor device according to the embodiment.

FIGS. 9 to 11 are graphs illustrating wafers used in the method for manufacturing the semiconductor device according to the first embodiment.

These figures show evaluation results of the unevenness of the upper surface 10 for three types of wafers having different level differences. In these figures, the horizontal axis is the position along the X-axis direction. In these figures, the vertical axis is the height.

In the example shown in FIG. 9, the level difference d1 is about 3.1 μm. In the example shown in FIG. 10, the level difference d1 is about 6.0 μm. In the example shown in FIG. 11, the level difference d1 is about 8.8 μm. As shown in these figures, the unevenness of the surface of the first region 11 and the unevenness of the surface of the second region 12 are extremely small compared to the level difference d1.

An example of experimental results relating to the wafers will now be described. In a first experiment, samples of the wafer were made in which the level difference d1 was modified. The states of the cracks of the samples were evaluated using a differential interference microscope. It was observed that the cracks 20X of the second semiconductor region 22 (referring to FIG. 5) extended through the level difference into the first semiconductor region 21 when the level difference d1 was 1 μm. The ratio of the number of the cracks 20X extending into the first semiconductor region 21 to the number of the cracks 20X in the second semiconductor region 22 is about 47%.

Conversely, the extension into the first semiconductor region 21 of the cracks 20X of the second semiconductor region 22 was not observed when the level difference d1 was 2 μm. Thus, the extension of the cracks can be suppressed reliably by setting the level difference d1 to be at least 2 μm.

Figure 12:
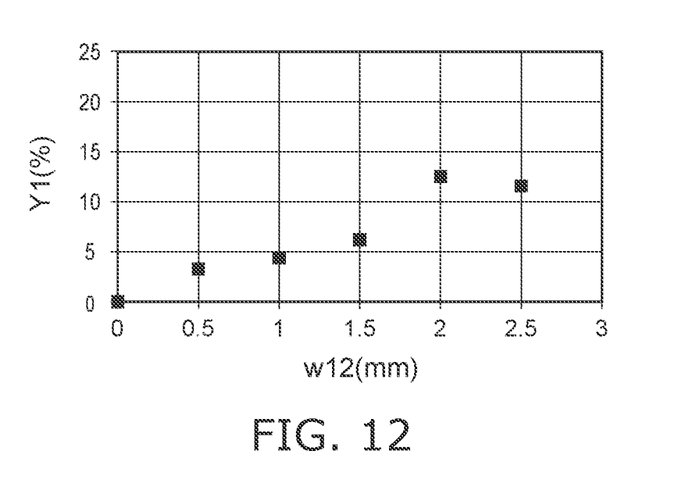
FIG. 12 is a graph illustrating test results relating to the method for manufacturing the semiconductor device according to the embodiment.

FIG. 12 is a graph illustrating test results relating to the method for manufacturing the semiconductor device according to the first embodiment.

FIG. 12 illustrates test results of characteristics of the semiconductor device (the LED) when manufactured while changing the width w12 (referring to FIG. 2) of the second region 12 (the region having the level difference). The horizontal axis of FIG. 12 is the width w12 (mm). The vertical axis is an improvement rate Y1 of the test of the semiconductor device. In the test, by acquiring an image in a state in which laser light is irradiated on the entire wafer, a surface area CR of the region where the cracks do not occur is calculated; and the ratio (CR/WR) of the surface area CR of the region where the cracks do not occur to a surface area WR of the entire wafer is used as the success rate. The improvement rate Y1 is the difference (YA−YB) between a success rate YB when the width w12 is 0 mm and a success rate YA when the width w12 is not 0 mm. The example is the results when the level difference d1 (referring to FIG. 2) is 6 μm. For example, when the cracks 20X extend into the first semiconductor region 21, the light emission characteristics of the semiconductor device degrade; and the improvement rate Y1 decreases.

As shown in FIG. 12, there is a tendency for the improvement rate Y1 to increase as the width w12 increases in the range where the width w12 is 1.5 mm or less. The increase of the improvement rate Y1 saturates when the width w12 is 2.0 mm or more. A stable and high improvement rate Y1 is obtained by setting the width w12 to be 2.0 mm or more.

Second Embodiment

The second embodiment relates to a wafer (e.g., the wafer 50 or the wafer 51 recited above or the like). The wafer 50 (referring to FIG. 2 and FIG. 3) will now be described. The wafer 50 according to the second embodiment has the upper surface 10. The upper surface 10 includes the first region 11 and the second region 12. The second region 12 is provided around the first region 11. The second region 12 is provided at a position at least 2 μm higher or lower than the first region 11.

In the second embodiment, the second region 12 is positioned at a position that is lower than the first region 11. For example, the first region 11 and the second region 12 are substantially parallel to each other (referring to FIG. 2). For example, the wafer 50 includes sapphire. In the second embodiment, the trench 12T (referring to FIG. 7 and FIG. 8) may be provided. The width dT of the trench 12T is, for example, not less than 10 μm and not more than 100 μm.

According to the second embodiment, a wafer can be provided in which the productivity can be increased.

Third Embodiment

A third embodiment relates to a semiconductor device. An example of the semiconductor device 110 shown in FIG. 6 will now be described.

As shown in FIG. 6, the semiconductor device 110 includes, for example, the wafer 50, and the semiconductor layer 20 provided at the upper surface 10 of the wafer 50. The wafer 50 includes the wafer (and modifications of the wafer) described in reference to the second embodiment. According to the semiconductor device 110, high productivity is obtained. In the third embodiment, the semiconductor device 110 includes the semiconductor layer 20 provided at the upper surface of the wafer 50. The semiconductor device 110 includes the state in which the wafer 50 on which the semiconductor layer 20 is provided is singulated.

As shown in FIG. 6, the semiconductor layer 20 includes the Al-including layer 35. The proportion of Al among the Group III elements of the Al-including layer 35 is not less than 3% (3 atomic %) and not more than 15% (15 atomic %). The proportion may be not less than 3% (3 atomic %) and not more than 8% (8 atomic %). The Al-including layer 35 is, for example, $Al_zGa_{1-z}N$ (0.03≤z≤0.15). The Al-including layer 35 may be, for example, $Al_zGa_{1-z}N$ (0.03≤z≤0.08). The thickness of the Al-including layer 35 (the total thickness) is, for example, not less than 20% and not more than 40% of the total film thickness of the semiconductor layer 20 (the thickness t1).

The light-emitting layer 33 may be provided in the semiconductor layer 20 (the semiconductor device 110). The peak wavelength of the light emitted from the light-emitting layer 33 is not less than 330 nm and not more than 400 nm. A portion of the Al-including layer 35 (e.g., the third film 31c, etc.) may be positioned between the light-emitting layer 33 and the wafer 50. The portion of the Al-including layer 35 recited above may be the third film 31c.

The semiconductor device 110 according to the third embodiment may include, for example, a transistor (a HEMT (High Electron Mobility Transistor) or the like). For example, in the HEMT, a nitride semiconductor layer (the semiconductor layer 20) that includes Al is provided at the wafer 50. Even in such a case, high productivity is obtained.

According to the embodiments described above, a semiconductor device and a method for manufacturing a semiconductor device can be provided in which the productivity can be increased.

In the specification of the application, "perpendicular" and "parallel" refer to not only strictly perpendicular and strictly parallel but also include, for example, a fluctuation due to manufacturing processes, etc. It is sufficient to be substantially perpendicular and substantially parallel.

Above, exemplary embodiments of the invention are described with reference to specific examples. However, the invention is not limited to the embodiments described above. For example, one skilled in the art may similarly practice the invention by appropriately selecting specific configurations of components included in methods for manufacturing semiconductor devices such as wafers, substrates, semiconductor structures, lasers, etc., from known art. Such practice is included in the scope of the invention to the extent that similar effects thereto are obtained.

Further, any two or more components of the specific examples may be combined within the extent of technical feasibility and are included in the scope of the invention to the extent that the purpose of the invention is obtained.

Moreover, all methods for manufacturing semiconductor devices, wafers, and semiconductor devices practicable by an appropriate design modification by one skilled in the art based on the methods for manufacturing semiconductor devices, the wafers, and the semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

What is claimed is:

1. A method for manufacturing a semiconductor device, the method comprising:
preparing a wafer comprising sapphire, wherein:
the wafer has an upper surface that includes a first region and a second region, the second region surrounding the first region and located at a position at least 2 μm higher or lower than the first region,
a distance between an inner end portion of the second region and an outer edge of the upper surface is not less than 2.0 mm and not more than 10 mm,
the wafer has a tapered surface that extends from the first region to the second region,
in a cross-section of the wafer, the tapered surface has a first surface portion at a first side of the first region, and a second surface portion at a second side of the first region opposite the first side, and
the tapered surface is tapered such that, in the cross-section of the wafer, a width between the first surface portion and the second surface portion at a bottom of the tapered surface is greater than a width between the first surface portion and the second surface portion at a top of the tapered surface; and forming a semiconductor layer at the upper surface of the wafer, the semiconductor layer comprising at least one layer that comprises $Al_zGa_{1-z}N$ ($0.03 \leq z \leq 0.15$).

2. The method according to claim 1, wherein the second region reaches an outer edge of the upper surface.

3. The method according to claim 2, wherein the second region is positioned at a position lower than the first region.

4. The method according to claim 2, wherein the first region and the second region are substantially parallel to each other.

5. The method according to claim 1, wherein the second region is positioned at a position lower than the first region.

6. The method according to claim 5, wherein the first region and the second region are substantially parallel to each other.

7. The method according to claim 1, wherein the first region and the second region are substantially parallel to each other.

8. A semiconductor device, comprising:
a wafer comprising sapphire, wherein:
the wafer has an upper surface that includes a first region and a second region, the second region surrounding the first region and located at a position at least 2 μm higher or lower than the first region,
a distance between an inner end portion of the second region and an outer edge of the upper surface is not less than 2.0 mm and not more than 10 mm,
the wafer has a tapered surface that extends from the first region to the second region,
in a cross-section of the wafer, the tapered surface has a first surface portion at a first side of the first region, and a second surface portion at a second side of the first region opposite the first side, and
the tapered surface is tapered such that, in the cross-section of the wafer, a width between the first surface portion and the second surface portion at a bottom of the tapered surface is greater than a width between the first surface portion and the second surface portion at a top of the tapered surface; and
a semiconductor layer located at the upper surface of the wafer, the semiconductor layer comprising at least one layer that comprises $Al_zGa_{1-z}$ ($0.03 \leq z \leq 0.15$).

9. The device according to claim 8, wherein the second region reaches an outer edge of the upper surface.

10. The device according to claim 9, wherein the second region is positioned at a position lower than the first region.

11. The device according to claim 9, wherein the first region and the second region are parallel to each other.

12. The device according to claim 8, wherein the second region is positioned at a position lower than the first region.

13. The device according to claim 12, wherein the first region and the second region are parallel to each other.

14. The device according to claim 8, wherein the first region and the second region are parallel to each other.

15. A method for manufacturing a semiconductor device, the method comprising:
preparing a wafer comprising sapphire, wherein:
the wafer has an upper surface that includes a first region and a second region, the second region surrounding the first region and located at a position at least 2 μm higher or lower than the first region,
the wafer has a tapered surface that extends from the first region to the second region,
in a cross-section of the wafer, the tapered surface has a first surface portion at a first side of the first region, and a second surface portion at a second side of the first region opposite the first side,
the tapered surface is tapered such that, in the cross-section of the wafer, a width between the first surface portion and the second surface portion at a bottom of the tapered surface is greater than a width between the first surface portion and the second surface portion at a top of the tapered surface
a bevel portion is located at a vicinity of an outer end of the wafer, and
an angle between the tapered surface and the second region is different from an angle between a surface of the bevel portion and the second region, and
forming a semiconductor layer at the upper surface of the wafer, the semiconductor layer comprising at least one layer that comprises $Al_zGa_{1-z}$ ($0.03 \leq z \leq 0.15$).

16. A semiconductor device, comprising:
a wafer comprising sapphire, wherein:
the wafer has an upper surface that includes a first region and a second region, the second region surrounding the first region and located at a position at least 2 μm higher or lower than the first region,
the wafer has a tapered surface that extends from the first region to the second region,
in a cross-section of the wafer, the tapered surface has a first surface portion at a first side of the first region, and a second surface portion at a second side of the first region opposite the first side,
the tapered surface is tapered such that, in the cross-section of the wafer, a width between the first surface portion and the second surface portion at a bottom of the tapered surface is greater than a width between the first surface portion and the second surface portion at a top of the tapered surface
a bevel portion is located at a vicinity of an outer end of the wafer, and
an angle between the tapered surface and the second region is different from an angle between a surface of the bevel portion and the second region; and
a semiconductor layer located at the upper surface of the wafer, the semiconductor layer comprising at least one layer that comprises $Al_zGa_{1-z}$ ($0.03 \leq z \leq 0.15$).

* * * * *

UNITED STATES PATENT AND TRADEMARK OFFICE
CERTIFICATE OF CORRECTION

PATENT NO. : 11,101,404 B2  
APPLICATION NO. : 16/354056  
DATED : August 24, 2021  
INVENTOR(S) : Yoshinori Miyamoto et al.

Page 1 of 1

It is certified that error appears in the above-identified patent and that said Letters Patent is hereby corrected as shown below:

In the Claims

Claim 8, Column 15, Line 42: delete "layer that comprises $Al_zGa_{1-z}$ ($0.03 \leq z \leq 0.15$)" and replace with "layer that comprises $Al_zGa_{1-z}N$ ($0.03 \leq z \leq 0.15$)"

Claim 15, Column 16, Line 24: delete "the bevel portion and the second region," and replace with "the bevel portion and the second region;"

Claim 15, Column 16, Line 27: delete "layer that comprises $Al_zGa_{1-z}$ ($0.03 \leq z \leq 0.15$)" and replace with "layer that comprises $Al_zGa_{1-z}N$ ($0.03 \leq z \leq 0.15$)"

Claim 16, Column 16, Line 53: delete "layer that comprises $Al_zGa_{1-z}$($0.03 \leq z \leq 0.15$)" and replace with "layer that comprises $Al_zGa_{1-z}N$ ($0.03 \leq z \leq 0.15$)"

Signed and Sealed this  
Twelfth Day of April, 2022

Drew Hirshfeld  
*Performing the Functions and Duties of the*  
*Under Secretary of Commerce for Intellectual Property and*  
*Director of the United States Patent and Trademark Office*